(12) United States Patent
Song et al.

(10) Patent No.: US 7,920,622 B2
(45) Date of Patent: Apr. 5, 2011

(54) DIGITAL BROADCASTING TRANSMITTER, TURBO STREAM PROCESSING METHOD THEREOF, AND DIGITAL BROADCASTING SYSTEM HAVING THE SAME

(75) Inventors: Dong-il Song, Suwon-si (KR); Hae-joo Jeong, Seoul (KR); Jung-pil Yu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 12/261,996

(22) Filed: Oct. 30, 2008

(65) Prior Publication Data

US 2009/0052523 A1    Feb. 26, 2009

Related U.S. Application Data

(63) Continuation of application No. 11/600,033, filed on Nov. 16, 2006.

(60) Provisional application No. 60/752,410, filed on Dec. 22, 2005.

(30) Foreign Application Priority Data

Jul. 24, 2006   (KR) .................................. 2006-69389

(51) Int. Cl.
*H04J 1/00* (2006.01)
*H04B 1/66* (2006.01)
*H04B 14/06* (2006.01)

(52) U.S. Cl. ...................... 375/240; 375/246; 370/485

(58) Field of Classification Search ............ 714/47, 714/48, 52, 53, 57, 746, 747, 751, 752, 759, 714/762, 784, 795, 798, 799; 370/485, 486, 370/487, 535, 537, 538, 392; 725/105, 89, 725/135, 143; 375/240.27, 316

See application file for complete search history.

(56) References Cited

U.S. PATENT DOCUMENTS 6,037,981 A * 3/2000 Wilson et al. ............ 375/240.12
(Continued)

FOREIGN PATENT DOCUMENTS

CN           1325592 A       12/2001
(Continued)

OTHER PUBLICATIONS

Search Report issued on Jan. 15, 2007 by the Korean Intellectual Property Office for International Patent Application No. PCT/KR2006/004110 filed on Oct. 12, 2006.
U.S. Appl. No. 60/752,410, filed Dec. 22, 2005, Dong-il Song et al., Samsung Electronics Co., Ltd.
(Continued)

*Primary Examiner* — Hanh Nguyen
(74) *Attorney, Agent, or Firm* — Sughrue Mion, PLLC

(57) ABSTRACT

A digital broadcasting transmitter, a turbo stream processing method thereof, and a digital broadcasting system having the same. The digital broadcasting transmitter includes a first compressor, forming a normal stream by compressing audio and video signals in a first compression format, a second compressor, forming a turbo stream by compressing the audio and video signals in a second compression format, a transport stream (TS) constructor, compressing the turbo stream in an H.264 format and forming the dual transfer stream by multiplexing the normal stream and the turbo stream, and a TS processor, robustly processing the dual transfer stream transmitted from the TS constructor, thus enhancing the transmission efficiency.

8 Claims, 4 Drawing Sheets

U.S. PATENT DOCUMENTS

| | | | |
|---|---|---|---|
| 6,760,077 B2 * | 7/2004 | Choi et al. | 348/614 |
| 7,593,474 B2 * | 9/2009 | Jeong et al. | 375/265 |
| 2002/0126222 A1 | 9/2002 | Choi et al. | |
| 2002/0154709 A1 * | 10/2002 | Choi et al. | 375/301 |
| 2003/0218693 A1 * | 11/2003 | Ikeguchi | 348/554 |
| 2004/0028076 A1 * | 2/2004 | Strolle et al. | 370/466 |
| 2004/0057535 A1 * | 3/2004 | Strolle et al. | 375/340 |
| 2005/0166123 A1 * | 7/2005 | Yanamoto et al. | 714/776 |
| 2005/0249301 A1 * | 11/2005 | Jeong et al. | 375/265 |
| 2009/0060025 A1 * | 3/2009 | Song et al. | 375/240 |
| 2009/0060054 A1 * | 3/2009 | Song et al. | 375/240.25 |
| 2009/0063695 A1 * | 3/2009 | Song et al. | 709/231 |

FOREIGN PATENT DOCUMENTS

| | | |
|---|---|---|
| CN | 1418433 A | 5/2003 |
| WO | WO 02/085014 | 10/2002 |
| WO | WO 2005/115001 | 12/2005 |

OTHER PUBLICATIONS

U.S. Appl. No. 11/600,033, filed Nov. 16, 2006, Dong-il Song et al., Samsung Electronics Co., Ltd.
U.S. Appl. No. 12/261,960, filed Oct. 30, 2008, Dong-il Song et al., Samsung Electronics Co., Ltd.
U.S. Appl. No. 12/261,983, filed Oct. 30, 2008, Dong-il Song et al., Samsung Electronics Co., Ltd.
U.S. Appl. No. 12/262,016, filed Oct. 30, 2008, Dong-il Song et al., Samsung Electronics Co., Ltd.
U.S. Appl. No. 10/262,029, filed Oct. 30, 2008, Dong-il Song et al., Samsung Electronics Co., Ltd.
Communication issued Jun. 28, 2010 by State Intellectual Property Office of P.R. China in counterpart Chinese Application No. 200680041427.X.

\* cited by examiner

FIG. 3A

| SYNC | PID | TURBO DATA |
|---|---|---|
| 1 | 3 | 184 |

FIG. 3B

| SYNC | PID | AF Header | Null data | NORMAL DATA |
|---|---|---|---|---|
| 1 | 3 | 2 | N | 182-N |

FIG. 3C

| SYNC | PID | AF Header | TURBO DATA | NORMAL DATA |
|---|---|---|---|---|
| 1 | 3 | 2 | N | 182-N |

FIG. 3D

| SYNC | PID | TURBO DATA |
|---|---|---|
| 1 | 3 | |
| SYNC | PID | NORMAL DATA |
| SYNC | PID | NORMAL DATA |
| SYNC | PID | NORMAL DATA |

...

DIGITAL BROADCASTING TRANSMITTER, TURBO STREAM PROCESSING METHOD THEREOF, AND DIGITAL BROADCASTING SYSTEM HAVING THE SAME

CROSS-REFERENCE TO RELATED APPLICATIONS

This application is a continuation of application Ser. No. 11/600,033, filed on Nov. 16, 2006, which claims the benefit of Korean Application No. 2006-69389, filed Jul. 24, 2006, in the Korean Intellectual Property Office and also claims the benefit under 35 U.S.C. §119(a) of U.S. Provisional Application No. 60/752,410, filed in the United States Patents and Trademark Office on Dec. 22, 2005, the disclosures of which are incorporated herein by reference.

BACKGROUND OF THE INVENTION

1. Field of the Invention

An aspect of the present invention relates to a digital broadcasting transmitter, a turbo stream processing method thereof, and a digital broadcasting system having the same. More particularly, an aspect of the present invention relates to a digital broadcasting transmitter which processes a normal stream and a turbo stream compressed in different formats from each other, a turbo stream processing method thereof, and a digital broadcasting system having the same.

2. Description of the Related Art

There are different digital broadcasting standards such as a U.S.-oriented advanced television system committee (ATSC) format and a European-oriented digital video broadcasting-handheld (DVB-H).

The U.S.-oriented transmission format is based on the National Television System Committee (NTSC) frequency band, and has the advantage of easily implementing a transmitter and receiver. The U.S.-oriented transmission format is a single carrier wave amplitude modulation vestigial side band (VSB) format, that is, this format can transmit high-quality video, audio and auxiliary data in the single 6 MHz bandwidth.

In the U.S.-oriented transmission format, an image signal is compressed in a moving picture experts group-2 (MPEG-2), a sound and voice signal is compressed in digital audio compression (AC-3), and the VSB technology is used to transmit such signals.

The reason why the image signal and the sound and voice signals are compressed in the MPEG-2 and AC-3, respectively is to reduce the bit rate of the image, voice and digital auxiliary data stream.

In the U.S.-oriented transmission format, the MPEG-2 used to compress an image signal has been developed for instances when a channel bandwidth or a storage capacity of a storing medium are limited, and when efficient transmission structure is needed. The MPEG-2 is a compression format which is interoperably designed with the asynchronous transfer mode (ATM) transmission structure.

Conventionally, only normal streams are used, but recently a dual transport stream adding a turbo stream with enhanced coding to the normal stream is used.

In this case, the compression performance and image quality of the turbo stream which is compressed in the conventional MPEG-2, is considerably decreased. Accordingly, the load on a transmission system and operating expenses of a broadcasting station are increased.

SUMMARY OF THE INVENTION

An aspect of embodiments of the present invention is to solve at least the above and/or other problems and/or disadvantages and to provide the advantages described below and/or other advantages. Accordingly, an aspect of embodiments of the present invention is to provide a digital broadcasting transmitter to enhance the compression performance and image quality by compressing a normal stream and a turbo stream of a dual transport stream in different formats, a turbo stream processing method thereof, and a digital broadcasting system having the same.

Accordingly, an aspect of the present invention provides a digital broadcasting transmitter, including a first compressor, forming a normal stream by compressing audio and video signals in a first compression format; a second compressor, forming a turbo stream by compressing the audio and video signals in a second compression format; a transport stream (TS) constructor, compressing the turbo stream in an H.264 format and forming the dual transfer stream by multiplexing the normal stream and the turbo stream; and a TS processor, robustly processing the dual transfer stream transmitted from the TS constructor.

According to another aspect of the present invention, the first compression format may include an MPEG-2 (Moving Picture Experts Group-2) format, and the second compression format may include an H.264 format.

According to another aspect of the present invention, the TS constructor may include an RS, encoder RS-encoding the compressed turbo stream; a place holder maker, adding a region to insert a parity to the RS-encoded turbo stream; an interleaver, interleaving the turbo stream with the region to insert the parity; and a TS multiplexer (MUX), multiplexing the interleaved turbo stream and the normal stream.

According to another aspect of the present invention, there is provided a turbo stream processing method of a digital broadcasting transmitter, including forming a normal stream by compressing audio and video signals in a first compression format; forming a turbo stream by compressing the audio and video signals in a second compression format; forming a dual transfer stream by multiplexing a normal stream and the turbo stream; and robustly processing the dual transfer stream.

According to another aspect of the present invention, the first compression format may include an MPEG-2 (Moving Picture Experts Group-2) format, and the second compression format may include an H.264 format.

According to another aspect of the present invention, the forming of the dual transfer stream may include RS-encoding the compressed turbo stream; adding a region to insert a parity to the RS-encoded turbo stream; interleaving the turbo stream added with the region to insert the parity; and multiplexing the interleaved turbo stream and the normal stream.

According to another aspect of the present invention, there is provided a digital broadcasting system, including a transmitter, forming a dual transfer stream by multiplexing a normal stream of a first compression format and a turbo stream of a second compression format, robust-processing the dual transfer stream and outputting the robust-processed dual transfer stream; and a receiver, receiving the dual transfer stream and recovering the normal stream and the turbo stream.

According to another aspect of the present invention, the first compression format may include an MPEG-2 (Moving Picture Experts Group-2) format, and the second compression format may include an H.264 format.

According to another aspect of the present invention, the transmitter may include a first compressor forming the normal stream by compressing audio and video signals in the first compression format; a second compressor forming the turbo stream by compressing the audio and video signals in the second compression format; a TS constructor forming a dual transfer stream by multiplexing the normal stream and the turbo stream; and a TS processor robust-processing the dual transfer stream received from the TS constructor.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 3A through 3D are views describing an H.264 packet constructed in the TS constructor of FIG. 2;

DETAILED DESCRIPTION OF THE EMBODIMENTS

Figure 1:
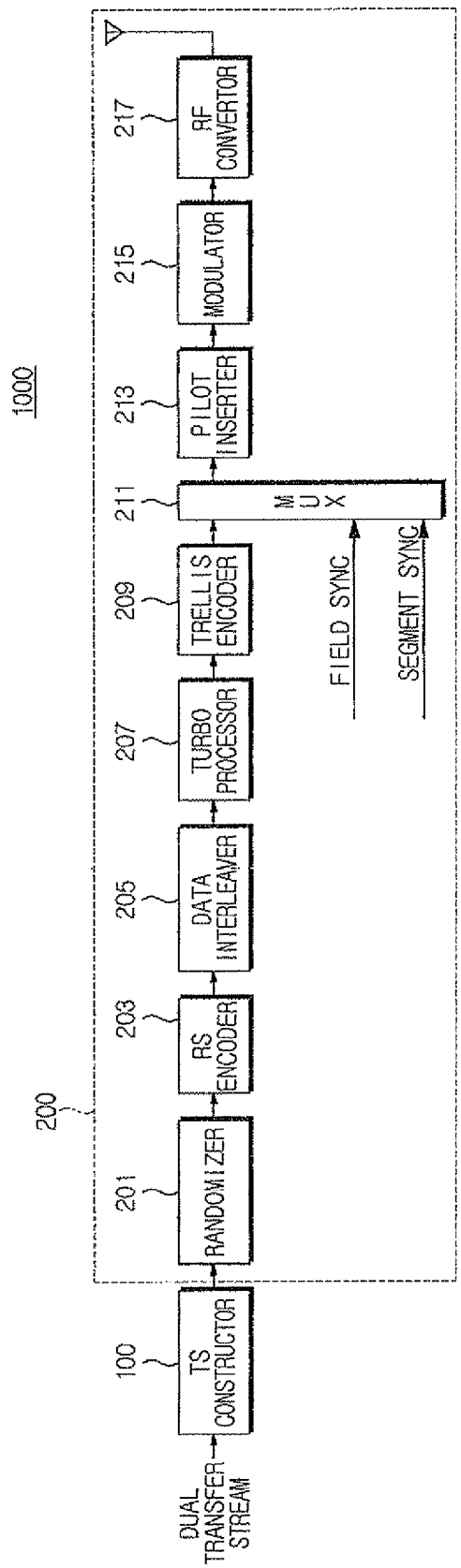
FIG. 1 is a block diagram describing a digital broadcasting transmitter according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram describing a digital broadcasting transmitter according to an embodiment of the present invention.

Referring to FIG. 1, the digital broadcasting transmitter 1000 according to an embodiment of the present invention includes a transport stream (TS) constructor 100 and a TS processor 200.

The TS constructor 100 compresses a turbo stream in the H.264 format, and multiplexes a normal stream and the turbo stream to construct a dual transport stream. The TS constructor 100 will be described in detail in FIG. 2.

The TS processor 200 robustly processes and transmits the dual transport stream transmitted from the TS constructor 100 to the receiver. The TS processor 200 includes a randomizer 201, a Reed-Solomon (RS) encoder 203, a data interleaver 205, a turbo processor 207, a trellis encoder 209, a multiplexer (MUX) 211, a pilot inserter 213, a modulator 215, and a radio frequency (RF) converter 217.

The randomizer 201 randomizes a dual transfer stream to make the best use of an allocated channel space.

The RS encoder 203 RS-encodes the dual transfer stream randomized by the randomizer 201. The RS encoder 203 may be a concatenated coder which adds a parity to the transfer stream to correct errors caused by channel features upon transmission.

The data interleaver 205 interleaves the dual transfer stream RS-encoded by the RS encoder 203. Data-interleaving does not alter data, but changes the location of frame in the frame of data.

In this embodiment, the data interleaver 205 is located between the RS encoder 203 and the turbo processor 207, but is not necessarily limited to this location. For example, the data interleaver 205 can be located between the turbo processor 207 and the trellis encoder 209.

The turbo processor 207 robustly processes the dual transfer stream interleaved by the data interleaver 205. More specifically, the turbo processor 207 separates the dual transfer stream into the normal stream and the turbo stream, passes the normal stream, turbo-codes the turbo stream, and multiplexes and outputs the normal stream and the turbo-coded turbo stream.

The trellis encoder 209 trellis-encodes the dual transfer stream robustly processed in the turbo processor 207. The trellis encoder 209 converts the dual transfer stream into a symbol, and performs symbol-mapping through trellis-encoding of certain rates.

The MUX 211 multiplexes the dual transfer stream by adding a segment sync and a field sync to the dual transfer stream trellis-encoded by the trellis encoder 209.

The pilot inserter 213 adds a pilot signal to the dual transfer stream including the field sync and the segment sync added by the MUX 211. The pilot signal occurs at a zero frequency point of a spectrum where a little bit of DC deviation is supplied to the 8-VSB baseband right before modulation and a little bit of residual carrier waves are modulated, and functions to synchronize an RF phase locked loop (PLL) circuit of the receiver regardless of the transfer signal.

The modulator 215 performs pulse-shaping for the transfer stream added with the pilot signal by the pilot inserter 213, loads the transfer stream into an intermediate frequency carrier wave, and performs VSB modulation to modulate the amplitude.

The RF converter 217 RF-converts and amplifies the transfer stream VSB-modulated by the modulator 215, and transmits the transfer stream through a channel allocated to a certain band.

Figure 2:
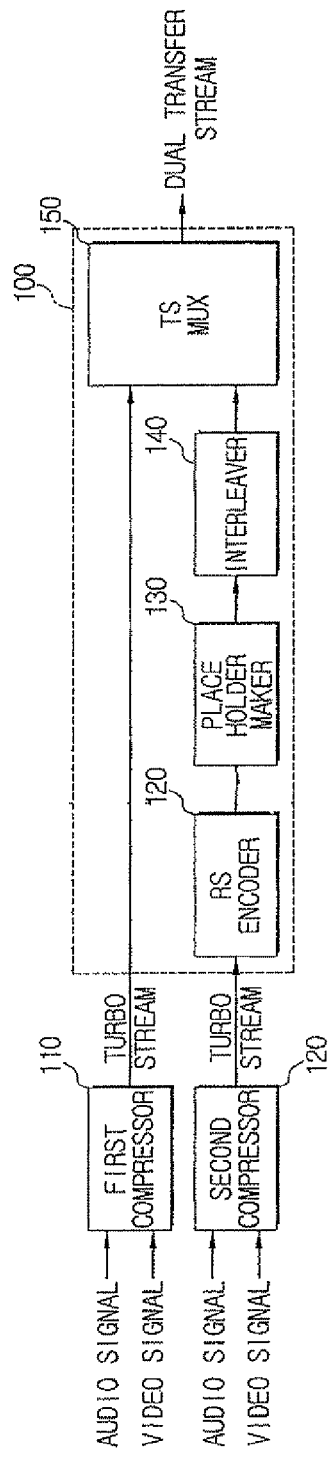
FIG. 2 is a block diagram describing the TS constructor of FIG. 1.

FIG. 2 is a block diagram describing the first and the second compressors, and the TS constructor.

Referring to FIG. 2, there are first and second compressors 10 and 20 provided at a front end of the TS constructor 100, and the TS constructor 100 includes an RS encoder 120, a place holder maker 130, an interleaver 140, and a TS MUX 150.

The first compressor 10 forms a normal stream by compressing audio signals and video signals according to a first compression format, and the normal stream is inputted to the TS constructor 100. The first compression format may preferably be in an MPEG-2 (Moving Picture Experts Group-2) format.

The second compressor 20 forms a turbo stream by compressing the audio signals and video signals according to a second compression format, and the turbo stream is inputted to the TS constructor 100. The second compression format may preferably be in an H.264 format.

The H.264 format is known as the advanced video coding, is a standard for coded expression of visual information, and emphasizes efficiency and reliability. Additionally, the H.264 format compresses approximately twice (about 50%) more efficient than the MPEG-2 format, and is approximately 1.5 times (about 35%) more efficient than the MPEG-4 format. Upon real-time compression such as broadcasting, the performance difference somewhat decreases, but is 30~40% more efficient than the MPEG-2 format.

For example, to implement the SD-level image quality, data has to be transmitted at the bit rate (the transmission rate of a digital signal) of 4 Mbps (4 million bits per second) in the MPEG-2 format, but 2 Mbps, which is half of the above bit rate, is enough in the H.264 format.

Good compression efficiency means less damage in the image quality in spite of the high compression rate. If the compression rate increases, the capacity decreases. Accordingly, if the compression performance is good higher resolution can be implemented when transmitted through a digital signal of less capacity.

In addition, if higher resolution can be implemented with less capacity, a frequency corresponding to the transmission route is less used. Therefore, in limited frequency resources, since the H.264 format can transmit using less capacity in the same frequency band, extra room is created in the frequency. Accordingly, if the H.264 format is used, more channel services are possible.

The RS encoder 120 adds and encodes the parity to the turbo stream compressed in the H.264 format by the second compressor 20.

The place holder maker 130 generates a region to insert a parity to the turbo stream, which will be added in the turbo processor 207 of the TS processor 200. For example, 1 byte of 8 bits, which is the construction unit of a turbo stream, is formed as 1 byte of 4 bits, so that 2 bytes are generated.

The interleaver 140 interleaves the turbo stream with the region for inserting the parity. The interleaver 140 can be omitted if necessary, or can be replaced with a different element. However, if the RS encoder 120 is included in the TS constructor 100, the interleaver 140 may be included in the TS constructor 100.

The TS MUX 150 constructs a dual transfer stream by multiplexing the normal stream input in the TS constructor 100, and the turbo stream interleaved in the interleaver 140, and outputs the dual transfer stream.

FIGS. 3A through 3D are views describing an H.264 packet constructed in the TS constructor of FIG. 2.

In general, a packet applied to the digital broadcasting consists of 1 byte of sync, 3 bytes of header, and 184 bytes of payload. The header of the packet includes a packet identifier (PID). A normal stream and a robust stream are separated according to a type of data included in the payload.

FIG. 3A exemplifies a turbo stream input to the TS constructor 100, including the turbo data in the payload part. That is, the turbo data, compressed in H.264 format by the second compressor 20, is input to the RS encoder 120, the place holder maker 130, the interleaver 140 and the TS MUX 150 of the TS constructor 100.

FIG. 3B exemplifies a normal stream input to the TS constructor 100, and the normal data is included in the payload part, and also includes an adaptation field to insert the turbo data considering connection to the turbo stream. The adaptation field includes 2 bytes of an AF header and an N byte of null data.

The turbo stream in FIG. 3A and the normal stream in FIG. 3B are multiplexed in the TS MUX 150 to form a dual transfer stream as in FIG. 3C.

FIG. 3D shows a different connection form of a turbo stream and a normal stream, a packet entirely includes a turbo stream or a normal stream. The TS MUX 140 arranges a turbo stream and a normal stream in the ratio of 1:3. The embodiment of arranging a turbo stream and a normal stream in the ratio of 1:3 is exemplified, but it is not limited to this embodiment.

The dual transfer streams in FIGS. 3A through 3D are similar to a dual transfer stream compressed in the conventional MPEG-2 format, but different in that the turbo stream compressed by H.264 format has a higher efficiency that the normal stream.

Figure 4:
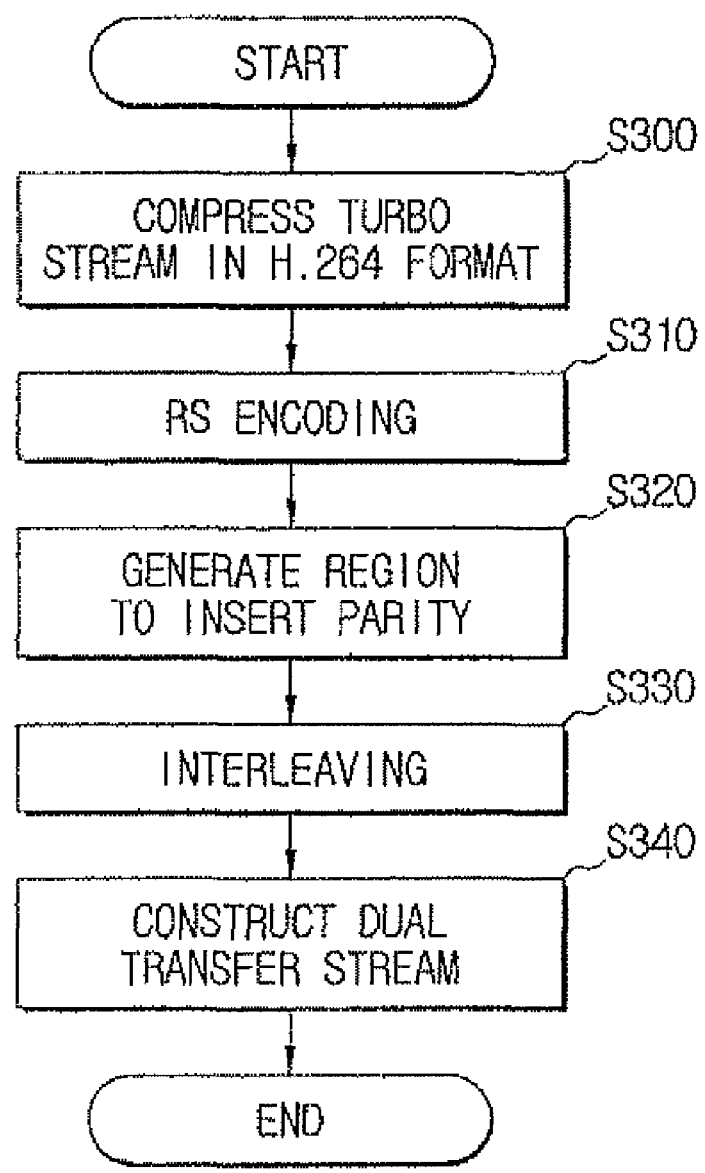
FIG. 4 is a flow chart describing a turbo stream processing method of a digital broadcasting transmitter according to an embodiment of the present invention.

FIG. 4 is a flow chart describing a turbo stream processing method of a digital broadcasting transmitter according to an embodiment of the present invention.

Referring to FIGS. 1-4, the turbo stream processing method of the digital broadcasting transmitter according to an embodiment of the present invention will be described.

The first compressor 10 forms a normal stream by compressing audio and video signals according to a first compression format (S300), and the second compressor 20 constructs a turbo stream by compressing audio and video signal according to a second compression format (S310).

The turbo stream compressed by the second compressor 20 is RS-encoded by being added with a parity by the RS encoder 120 (S310), and the place holder maker 130 generates a region to be added with a parity in the TS processor 200 (S320).

The turbo stream with a region to be added with a parity is interleaved by the interleaver 140 (S330), and is input to the TS MUX 150. The TS MUX 150 multiplexes the normal stream and the turbo stream to form a dual transfer stream (S340).

Next, the dual transfer stream is input to the TS processor 200, passes randomization, RS encoding, interleaving, turbo coding, trellis encoding, multiplexing, pilot insertion, VSB modulation, and RF conversion, and is transmitted through a channel.

Figure 5:
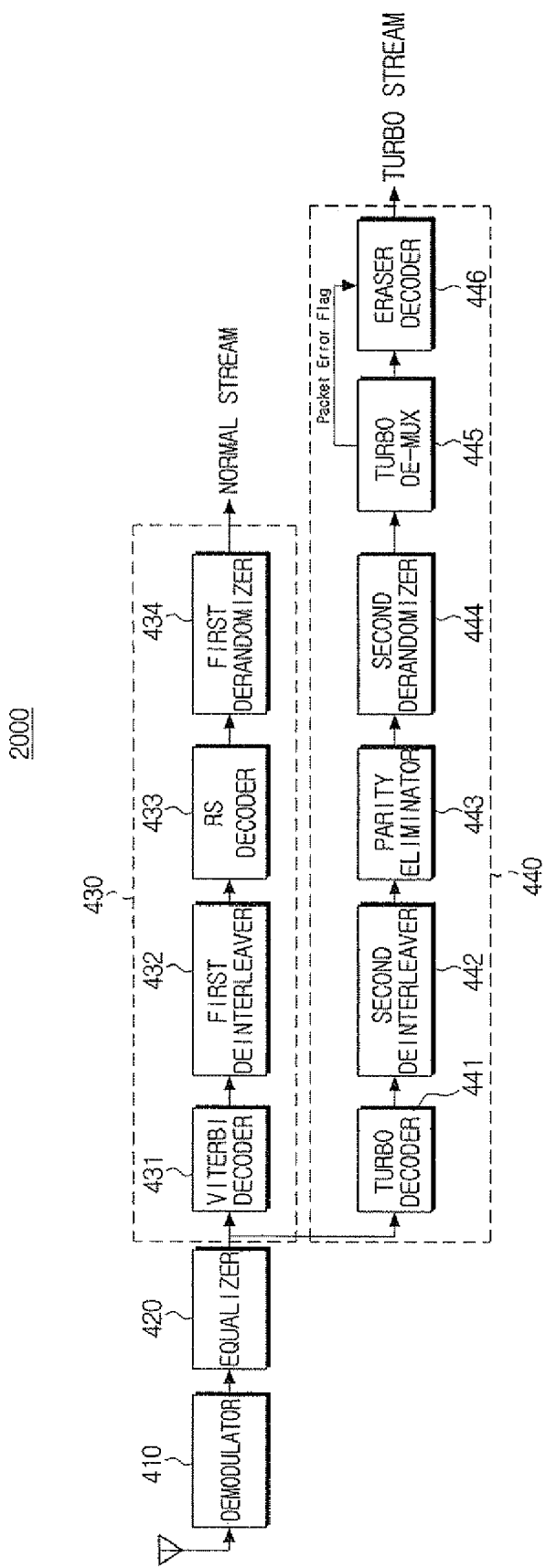
FIG. 5 is a block diagram of a digital broadcasting receiver according to an embodiment of the present invention.

FIG. 5 is a block diagram of a digital broadcasting receiver according to an embodiment of the present invention.

Referring to FIG. 5, the digital broadcasting receiver 2000 includes a demodulator 410, an equalizer 420, a first processor 430 and a second processor 440.

The demodulator 410 detects synchronization of a synchronous signal appended to a baseband signal of the dual TS received from the digital broadcasting transmitter 1000, and accordingly performs demodulation of the dual TS.

The equalizer 420 equalizes the demodulated dual TS, and compensates for a multi-path channel distortion. The dual TS, when equalized by the equalizer 420, is then provided to the first and second processors 430 and 440.

The first processor 430 processes the normal stream of the dual TS, and thus recovers the normal stream. The first processor 430 includes a viterbi decoder 431, a first deinterleaver 432, an RS decoder 433 and a first derandomizer 434.

The viterbi decoder 431 performs error correction of the normal stream of the equalized dual TS, decodes the error-corrected symbol, and outputs the decoded normal stream packet.

The first deinterleaver 432 deinterleaves the decoded normal stream packet to rearrange the distributed packets.

The RS decoder 433 RS-decodes the deinterleaved normal stream packet to correct errors.

The first derandomizer 434 derandomizes the RS-decoded normal stream packet to recover the normal stream data.

Meanwhile, the second processor 440 processes the turbo stream of the dual TS to recover the turbo stream data. With reference to FIG. 5, the second processor 440 includes a turbo decoder 441, a second deinterleaver 442, a parity eliminator 443, a second derandomizer 444, a turbo de-MUX 445, and an eraser decoder 446.

The turbo decoder 441 performs turbo decoding of the turbo stream of the equalized dual TS. The turbo decoder 441 inserts the turbo stream back into the dual TS to reconstruct the dual TS when the turbo decoding is completed.

The second deinterleaver 442 deinterleaves the reconstructed dual TS to rearrange the packets.

The parity eliminator 443 removes parities from the deinterleaved dual TS.

The second derandomizer 444 derandomizes the parity-removed dual TS.

The turbo de-MUX 445 demultiplexes the derandomized dual TS to recover turbo stream data.

The eraser decoder 446 performs eraser decoding with the recovered turbo stream data.

The transmitter 1000 performs eraser encoding to remove noise, and then inserts the turbo stream to the normal stream to form a dual TS. Therefore, as the eraser decoder 446 of the receiver 2000 performs eraser decoding on the eraser-encoded turbo stream of the transmitter 1000, noise of the turbo stream can be removed and reception improved.

FIG. 5 only exemplifies a digital broadcasting receiver 2000 according to an embodiment of the present invention, and therefore is not limited to this example only. Therefore, many alternatives, modifications, and variations may be adequately made. For example, the second processor 440 may include the turbo decoder 441 only, while the first processor 430 is made to process the normal stream and the turbo stream, respectively.

As can be appreciated from the above description of a digital broadcasting transmitter, a turbo stream processing method thereof, and a digital broadcasting system having the same according to an embodiment of the present invention, the normal stream is processed in MPEG-2 format and the turbo stream is compressed in the H.264 format, making it more efficient to use the turbo stream in the present A-VSB system.

Therefore, the following benefits can be attained from the above system and method, broadcasting of similar image quality can be implemented at a lower transmission rate, broadcasting of a better image quality is possible at the same rate as the transmission rate of the MPEG-2 format, and broadcasting of the similar image quality can be implemented in various channels. Accordingly, operating expenses of a broadcasting station can be reduced and profits maximized.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcast receiver, comprising:
    a demodulator to demodulate an additional data stream if a transport stream (TS) comprising a normal data stream and the additional data stream is received;
    an equalizer to equalize the TS;
    a first processor to process the normal data stream of the TS and recover normal data; and
    a second processor to process the additional data stream of the TS and recover additional data,
    wherein the second processor comprises:
    a turbo decoder to decode the additional data stream of the TS in order to correct errors in the additional data stream,
    a second deinterleaver to deinterleave the decoded additional data stream,
    a parity eliminator to remove a parity from the deinterleaved additional data stream, and
    a second derandomizer to derandomize the parity-removed additional data stream,
    wherein the normal data stream and the additional data stream are compressed in different compression formats, and
    the additional data stream is processed robustly.

2. The digital broadcast receiver of claim 1, wherein the first processor comprises a decoder to decode the normal data stream of the TS in order to correct errors in the normal data stream.

3. The digital broadcast receiver of claim 2, wherein the first processor further comprises:
    a first deinterleaver to deinterleave the decoded normal data stream;
    a Reed-Solomon (RS) decoder to RS-decode the deinterleaved normal data stream; and
    a first derandomizer to derandomize the RS-decoded normal data stream and recover normal data.

4. The digital broadcast receiver of claim 1, wherein the normal data stream is compressed in a Moving Picture Experts Group-2 (MPEG-2) format, and the additional data stream is compressed in an H.264 format or MPEG-4 format.

5. A stream processing method of a digital broadcast receiver, comprising:
    receiving a transport stream (TS) comprising a normal data stream and an additional data stream;
    demodulating the additional data stream of the TS;
    equalizing the TS; and
    processing the normal data stream of the TS and recovering normal data; and
    processing the additional data stream of the TS and recovering additional data,
    wherein the processing of the additional data stream comprises:
    decoding the additional data stream of the TS in order to correct errors in the additional data stream,
    inserting the decoded additional data stream into the TS to reconstruct the decoded additional data stream,
    deinterleaving the reconstructed additional data stream,
    removing a parity from the deinterleaved additional data stream, and
    derandomizing the parity-removed additional data stream,
    wherein the normal data stream and the additional data stream are compressed in different compression formats, and
    the additional data stream is processed robustly.

6. The stream processing method of claim 5, wherein the processing of the normal data stream comprises decoding the normal data stream of the TS in order to correct errors in the normal data stream.

7. The stream processing method of claim 6, wherein the processing of the normal data stream further comprises:
    deinterleaving the decoded normal data stream;
    Reed-Solomon (RS)-decoding the deinterleaved normal data stream; and
    derandomizing the RS-decoded normal data stream and recovering normal data.

8. The stream processing method of claim 5, wherein the normal data stream is compressed in a Moving Picture Experts Group-2 (MPEG-2) format, and the additional data stream is compressed in an H.264 format or MPEG-4 format.

* * * * *